United States Patent
Yu et al.

(10) Patent No.: US 9,583,415 B2
(45) Date of Patent: Feb. 28, 2017

(54) PACKAGES WITH THERMAL INTERFACE MATERIAL ON THE SIDEWALLS OF STACKED DIES

(71) Applicant: Taiwan Semiconductor Manufacturing Company, Ltd., Hsin-Chu (TW)

(72) Inventors: Chen-Hua Yu, Hsin-Chu (TW); Wensen Hung, Zhubei (TW); Szu-Po Huang, Taichung (TW); An-Jhih Su, Bade (TW); Hsiang-Fan Lee, Hsin-Chu (TW); Kim Hong Chen, Fremont, CA (US); Chi-Hsi Wu, Hsin-Chu (TW); Shin-Puu Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 35 days.

(21) Appl. No.: 14/056,390

(22) Filed: Oct. 17, 2013

(65) Prior Publication Data
US 2015/0108628 A1     Apr. 23, 2015

(51) Int. Cl.
*H01L 23/42*     (2006.01)
*H01L 23/367*    (2006.01)
(Continued)

(52) U.S. Cl.
CPC ........... *H01L 23/42* (2013.01); *H01L 23/36* (2013.01); *H01L 23/3675* (2013.01); *H01L 23/10* (2013.01); *H01L 23/3128* (2013.01); *H01L 23/49816* (2013.01); *H01L 23/5385* (2013.01); *H01L 2224/16145* (2013.01);
(Continued)

(58) Field of Classification Search
CPC ... H01L 23/36; H01L 23/3675; H01L 23/373; H01L 23/42; H01L 23/46; H01L 23/467; H01L 23/473; H01L 2924/00
See application file for complete search history.

(56) References Cited

U.S. PATENT DOCUMENTS 5,216,580 A * 6/1993 Davidson ............ F28D 15/0266
                                              165/104.33
5,253,702 A * 10/1993 Davidson ............ F28D 15/0233
                                              165/104.14
(Continued)

OTHER PUBLICATIONS

Ajami, Amir H., et al. "Modeling and Analysis of Nonuniform Substrate Temperature Effects on Global ULSI Interconnects," IEEE Transactions on Computer-Aided Design of Integrated Circuits and Systems, vol. 24, No. 6, Jun. 2005, 13 pages.
(Continued)

*Primary Examiner* — Fernando L Toledo
*Assistant Examiner* — Christine L Hagan
(74) *Attorney, Agent, or Firm* — Slater Matsil, LLP

(57) ABSTRACT

A package includes a die stack that includes at least two stacked dies, and a Thermal Interface Material (TIM). The TIM includes a top portion over and contacting a top surface of the die stack, and a sidewall portion extending from the top portion down to lower than at least one of the at least two stacked dies. A first metallic heat-dissipating feature is over and contacting the top portion of TIM. A second metallic heat-dissipating feature has a sidewall contacting a sidewall of the sidewall portion of the TIM.

19 Claims, 16 Drawing Sheets

(51) Int. Cl.
*H01L 23/36* (2006.01)
*H01L 23/31* (2006.01)
*H01L 23/498* (2006.01)
*H01L 23/10* (2006.01)
*H01L 23/538* (2006.01)

(52) U.S. Cl.
CPC ........... *H01L 2224/16225* (2013.01); *H01L 2224/32225* (2013.01); *H01L 2224/73204* (2013.01); *H01L 2924/0002* (2013.01); *H01L 2924/15174* (2013.01); *H01L 2924/15311* (2013.01)

(56) References Cited

U.S. PATENT DOCUMENTS

| | | | | |
|---|---|---|---|---|
| 5,268,812 | A * | 12/1993 | Conte | F28D 15/0233 165/104.33 |
| 5,283,715 | A * | 2/1994 | Carlsten | H05K 7/20336 165/104.33 |
| 5,548,482 | A * | 8/1996 | Hatauchi et al. | 361/720 |
| 5,560,423 | A * | 10/1996 | Larson | F28D 15/0241 165/104.26 |
| 5,727,619 | A * | 3/1998 | Yao | B64G 1/50 165/104.21 |
| 5,880,524 | A * | 3/1999 | Xie | H01L 23/427 257/704 |
| 5,940,271 | A * | 8/1999 | Mertol | H01L 23/4093 165/185 |
| 6,212,074 | B1 * | 4/2001 | Gonsalves | H01L 23/4006 165/185 |
| 6,229,702 | B1 * | 5/2001 | Tao | H01L 23/3675 165/80.2 |
| 6,437,240 | B2 * | 8/2002 | Smith | 174/541 |
| 6,437,437 | B1 * | 8/2002 | Zuo | F28D 15/0233 257/704 |
| 7,134,486 | B2 * | 11/2006 | Santiago | B01D 19/0031 165/104.28 |
| 7,208,975 | B1 * | 4/2007 | Agrawal | H03K 19/17736 326/38 |
| 7,250,576 | B2 * | 7/2007 | Colgan | H01L 23/04 174/252 |
| 7,369,410 | B2 * | 5/2008 | Chen | F28D 15/0233 165/104.21 |
| 7,592,697 | B2 | 9/2009 | Arana et al. | |
| 7,714,423 | B2 * | 5/2010 | Reid | H05K 1/021 257/685 |
| 7,755,184 | B2 * | 7/2010 | Macris | H01L 23/42 257/706 |
| 7,990,711 | B1 * | 8/2011 | Andry | H01L 23/147 165/80.4 |
| 8,034,662 | B2 * | 10/2011 | Touzelbaev | H01L 23/42 438/106 |
| 8,526,186 | B2 * | 9/2013 | Yokoya | H01L 23/36 165/104.33 |
| 8,558,372 | B2 * | 10/2013 | Negoro | H01L 23/13 257/706 |
| 8,979,575 | B2 * | 3/2015 | Cheng | H05K 7/2039 439/487 |
| 9,076,754 | B2 * | 7/2015 | Hung | H01L 23/3672 |
| 9,082,743 | B2 * | 7/2015 | Hung | H01L 23/3675 257/686 |
| 2005/0161192 | A1 | 7/2005 | Shigeura et al. | |
| 2006/0261467 | A1 * | 11/2006 | Colgan | H01L 23/04 257/707 |
| 2008/0093733 | A1 * | 4/2008 | Hsu | 257/722 |
| 2009/0057881 | A1 | 3/2009 | Arana et al. | |
| 2009/0283902 | A1 * | 11/2009 | Bezama et al. | 257/713 |
| 2010/0213600 | A1 | 8/2010 | Lau et al. | |
| 2011/0012255 | A1 * | 1/2011 | Suganuma | 257/712 |
| 2011/0018125 | A1 * | 1/2011 | Loo et al. | 257/706 |
| 2011/0147916 | A1 * | 6/2011 | Su | 257/692 |
| 2012/0025397 | A1 * | 2/2012 | Miller | H01L 23/50 257/777 |
| 2012/0049341 | A1 | 3/2012 | Bezama et al. | |
| 2013/0119528 | A1 * | 5/2013 | Groothuis et al. | 257/690 |
| 2014/0061893 | A1 | 3/2014 | Saeidi et al. | |
| 2014/0217575 | A1 | 8/2014 | Hung | |
| 2015/0155218 | A1 * | 6/2015 | Hung | H01L 23/36 257/690 |
| 2015/0162307 | A1 * | 6/2015 | Chen | H01L 23/49827 257/712 |
| 2015/0262904 | A1 * | 9/2015 | Hung | H01L 23/367 257/713 |

OTHER PUBLICATIONS

De Orio, R.L., et al., "Physically based models of electromigration: From Black's equation to modern TCAD models," Elsevier Ltd., Microelectronics Reliability, 50, Mar. 2010, pp. 775-789.

* cited by examiner

PACKAGES WITH THERMAL INTERFACE MATERIAL ON THE SIDEWALLS OF STACKED DIES

CROSS REFERENCES TO RELATED APPLICATIONS

This patent application is related to U.S. patent application Ser. No. 13/957,727, filed Aug. 2, 2013, and entitled "3DIC Packages with Heat Dissipation Structures," which application is hereby incorporated by reference.

BACKGROUND

In the packaging of integrated circuits, semiconductor dies may be stacked through bonding, and may be bonded to other package components such as interposers and package substrates. The resulting packages are known as Three-Dimensional Integrated Circuits (3DICs). The heat dissipation is a challenge in the 3DICs. There exists a bottleneck in efficiently dissipating the heat generated in the inner dies of the 3DICs. The heat generated in the inner dies has to be dissipated to outer components such as outer dies before the heat can be conducted to any heat spreader. Between the stacked dies, however, there exist other materials such as underfill, molding compound, etc, which are not effective in conducting heat. Furthermore, the stacked dies may also be molded in a molding compound, which prevents the efficient heat dissipation.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 7 through 10A are cross-sectional views of intermediate stages in the formation of a package in accordance with some exemplary embodiments, wherein the package includes a TIM on the sidewalls of stacked dies, and wherein the package includes a heat dissipating lid and a heat dissipating ring;

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A package with improved heat dissipating ability and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

Figure 1:
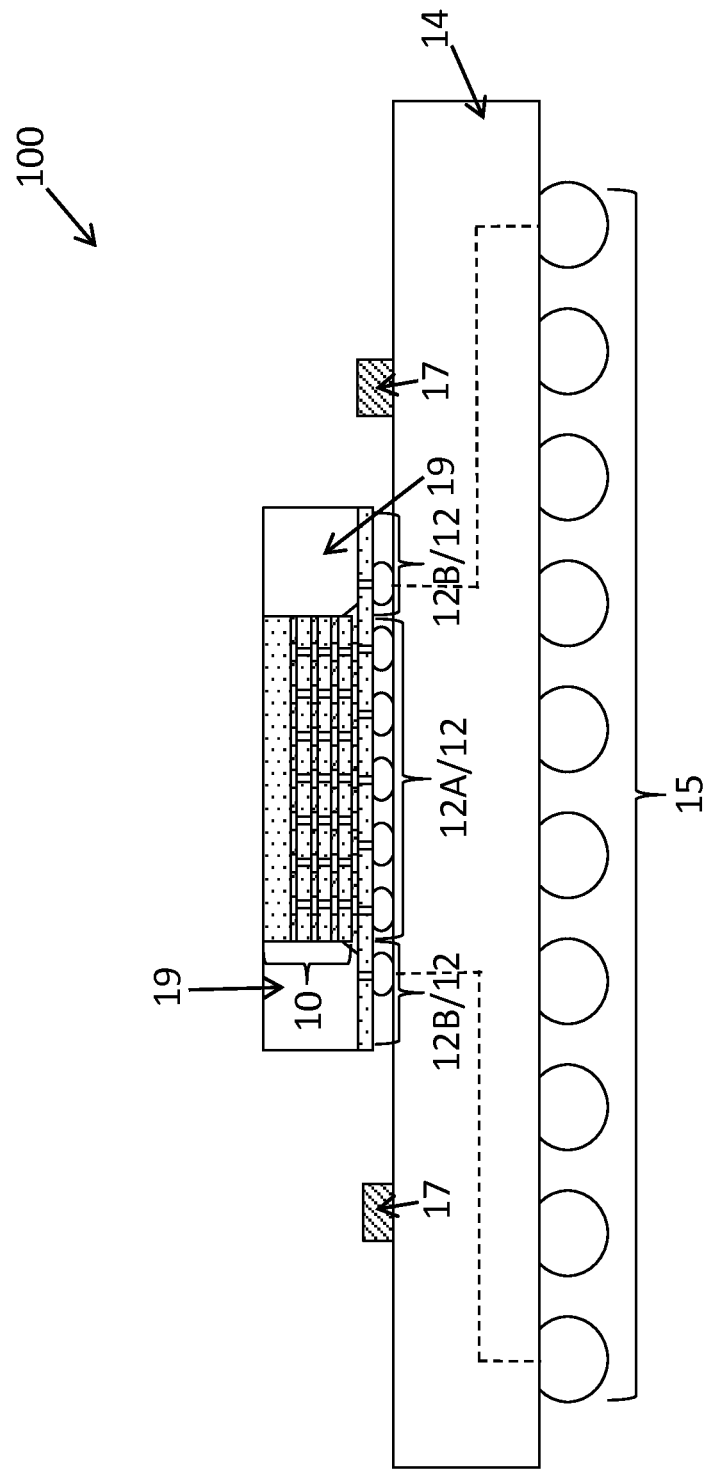
FIGS. 1 through 4 are cross-sectional views of intermediate stages in the formation of a package in accordance with some exemplary embodiments, wherein the package includes a Thermal Interface Material (TIM) on the sidewalls of stacked dies.

FIG. 1 illustrates the cross-sectional view of an initial stage in the formation of Three-Dimensional Integrated Circuit (3DIC) package 100, which includes dies 10 stacked on die 12. In some embodiments, dies 10 are memory dies that form a memory stack. In alternative embodiments, dies 10 are logic dies. In yet alternative embodiments, dies 10 include both logic dies and memory dies. Die 12 may be a logic die, which may further be a Central Processing Unit (CPU), a Graphics Processing Unit (GPU), or the like. Dies 10 and 12 may be bonded through flip chip bonding, wherein metal bumps, solder balls, or the like are used to bond dies 10 and 12.

Die 12 may have a top view size greater than the top view size of dies 10. As shown in FIG. 1, die 12 may extend laterally beyond dies 10, and may include portion 12A that is overlapped by dies 10, and portions 12B that are not overlapped by dies 10. The die stack including dies 10 and 12 are further bonded to package component 14, which may be a package substrate, an interposer, a Printed Circuit Board (PCB), or the like. In some embodiments, package component 14 includes metal traces (illustrated using dashed lines) that interconnect the electrical connectors (such as metal pads and/or solder balls) on the opposite sides of package component 14. Discrete passive devices 17 such as resistors, capacitors, transformers, and the like, may also be bonded to package component 14. Solder balls 15 are attached to package component 14, wherein dies 10/12 and solder balls 15 are on the opposite sides of package component 14. Throughout the description, the stacked dies 10 and 12 are in combination referred to as die stack 10/12.

In some embodiments, molding compound 19 molds stacked dies 12 therein. Molding compound 19 may also overlap portions 12B of die 12. In some embodiments, the top die in dies 10 has a top surface coplanar with the top surfaces of molding compound 19. In a top view of the structure in FIG. 1, molding compound 19 may form a full ring encircling die stack 10/12. In alternative embodiments, molding compound 19 does not form a full ring, and may include a single piece or a plurality of discrete pieces.

Figure 2:
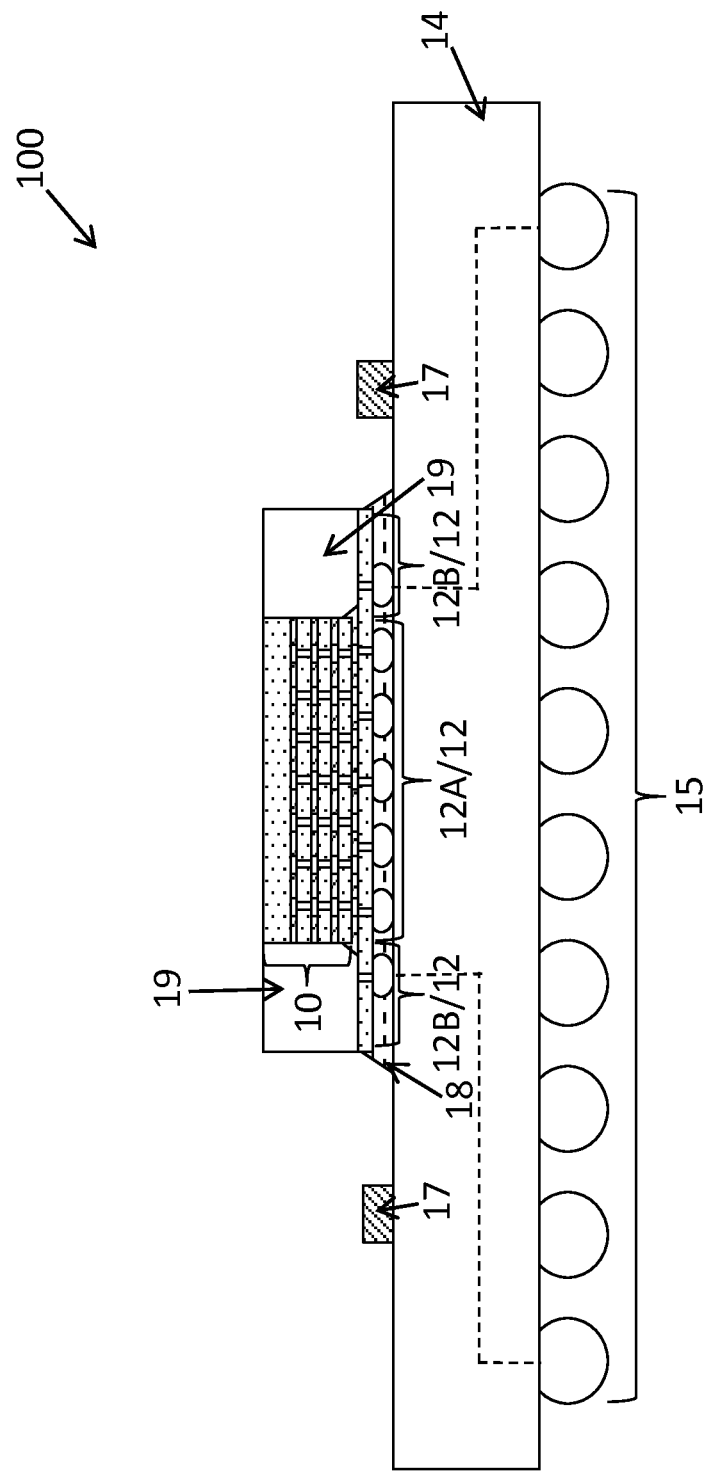

Referring to FIG. 2, underfill 18 is disposed to the space between die 12 and package component 14. A reflow may then be performed to reflow the solder balls in the package in FIG. 2.

Figure 3:
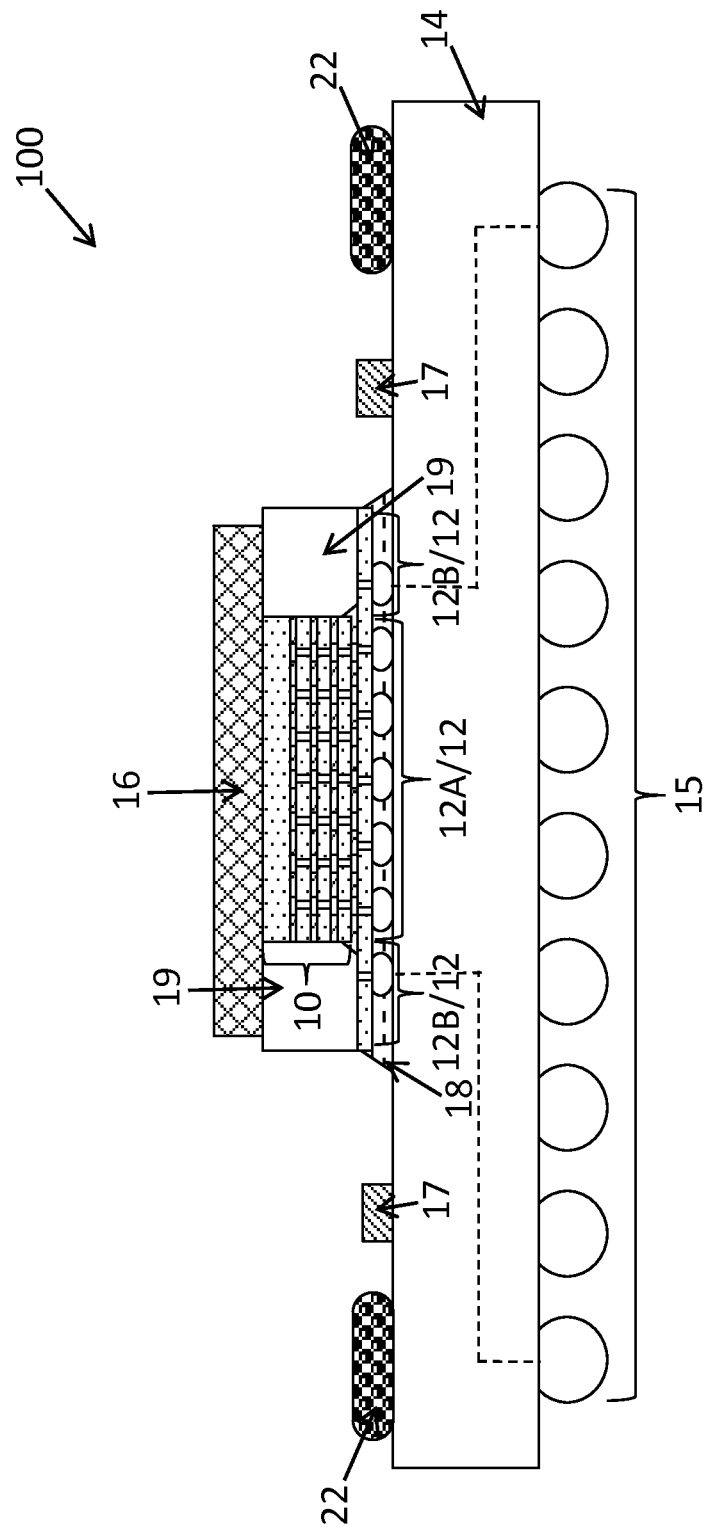

Next, referring to FIG. 3, Thermal Interface Material (TIM) 16 is dispensed on die stack 10/12. TIM 16 has a good thermal conductivity, which may be greater than about 2 W/m*K, and may be equal to, or higher than, about 10 W/m*K or 50 W/m*K. Adhesive 22 is disposed over and contacting package component 14. Adhesive 22 has a thermal conductivity lower than the thermal conductivity of TIM 16. For example, adhesive 22 may have a thermal conductivity lower than about 0.5 W/m*K. Adhesive 22 may have a better adhering ability than TIM 16.

Figure 4:
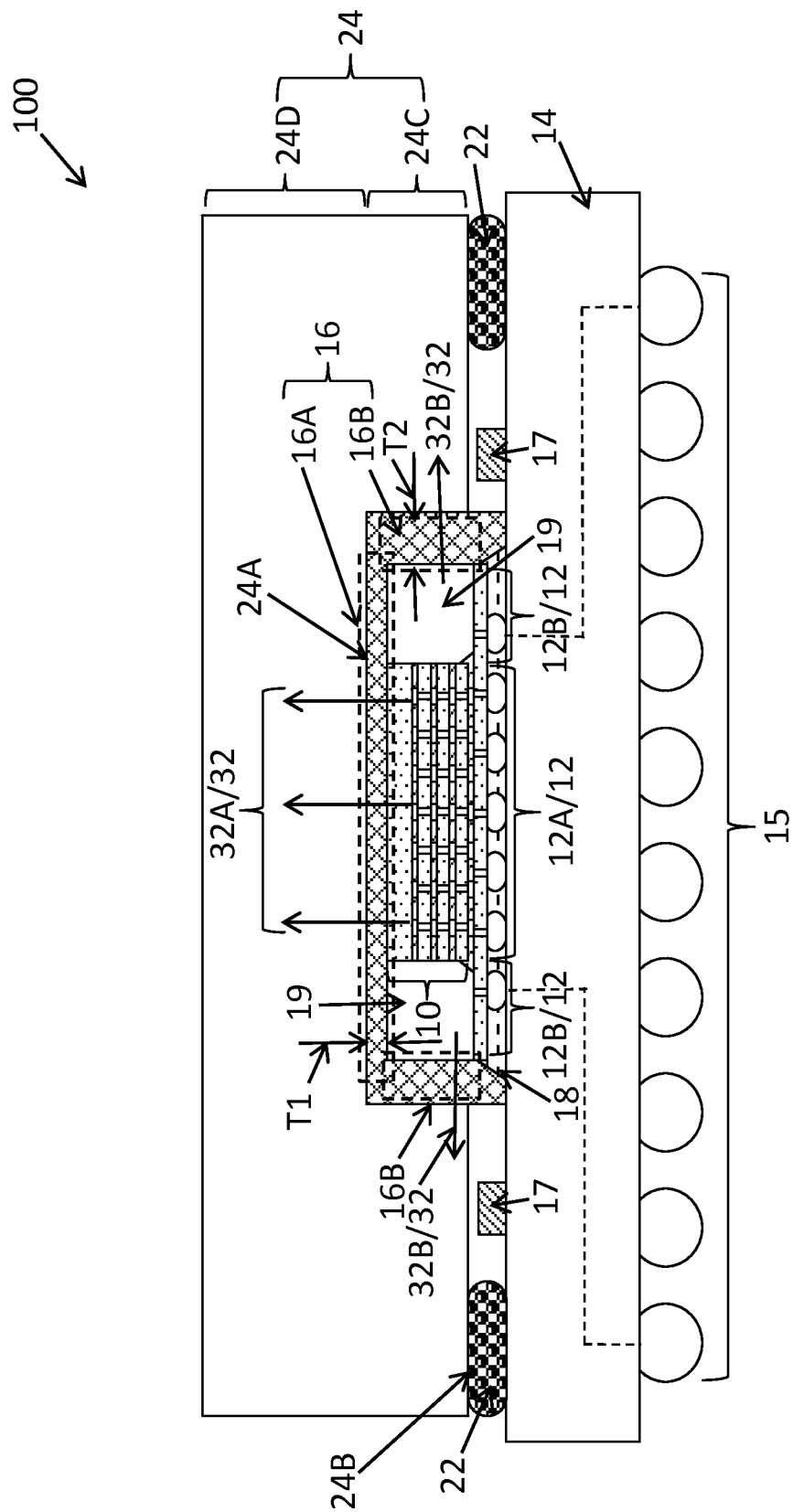

Next, as shown in FIG. 4, heat dissipating lid 24 is mounted. Throughout the description, heat dissipating lid 24 and heat dissipating ring 20 (FIG. 10A) are alternatively referred to as heat dissipating features. Heat dissipating lid 24 includes bottom surface 24A and bottom surface 24B. The positions of bottom surfaces 24A and 24B are designed to fit the height of the top surface of dies 10. Bottom surface 24A is in contact with TIM 16. Bottom surface 24B is in contact with adhesive 22, which adheres heat dissipating lid 24 to package component 14. Heat dissipating lid 24 includes top portion 24D and ring portion 24C. The top view of ring portion 24C may form a ring encircling dies 10 and 12, although it may also form a partial ring, or may include a plurality of separated pieces. Throughout the description, top portion 24D and ring portion 24C are also referred to as heat dissipating features, although the heat dissipating features 24C and 24D are interconnected to form a single integrated feature in the embodiments shown in FIG. 4.

In the mounting of heat dissipating lid 24, heat dissipating lid 24 is pushed down. As a result, TIM 16 is squeezed, and is pushed to the sidewalls of molding compound 19. The resulting TIM 16 includes top portion 16A, which is dispensed on the top of dies 10. Furthermore, TIM 16 includes sidewall portions 16B, which are in physical contact with the sidewalls of molding compound 19. Sidewall TIM portions 16B may, or may not, form a ring. In accordance with some embodiments, when forming a ring, TIM portions 16B encircle die stack 10/12, and hence are also referred to in combination as a ring portion. The bottom ends of TIM portion 16B is lower than at least one, and possible some or all dies 10, and possibly lower than the bottom surface of die 12. In some embodiments, TIM portions 16B extend to lower than the bottom surface 24B of heat dissipating lid 24. TIM 16 may, or may not, contact underfill 18, depending on the amount of the dispensed TIM 16.

Heat dissipation lid 24 has a high thermal conductivity greater than about 100 W/m*K, for example, and may be formed using a metal, a metal alloy, or the like. For example, heat dissipation lid 24 may comprise a metal or a metal alloy, with the respective metals selected from the group consisting of Al, Cu, Ni, Co, and the like. Heat dissipation lid 24 may also be formed of a composite material selected from the group consisting of silicon carbide, aluminum nitride, graphite, and the like.

In some embodiments, thickness T1 of the top TIM portion 16A is between about 50 µm and about 100 µm. Thickness T1 may also be in the range between about 100 µm and about 200 µm. Thickness T2 of the sidewall TIM portion 16B is between about 1.0 mm and about 2.0 mm. It is appreciated, however, that the values recited throughout the description are merely examples, and may be changed to different values.

FIG. 4 also illustrates the heat dissipating paths 32 (including 32A and 32B), which are represented by arrows. From die stacks 10/12, there are two major heat dissipating paths 32A and 32B, wherein heat dissipating paths 32A are in the vertical direction, and heat dissipating paths 32B are in the horizontal direction. The horizontal dissipating paths 32B exist since the sidewall TIM portions 16B have the function of dissipating heat to the ring portion 24C of heat dissipating lid 24. With package 100 including both vertical and the horizontal heat dissipating paths, the heat dissipating efficiency of package 100 is improved over the packages that have vertical paths only.

Figure 5:
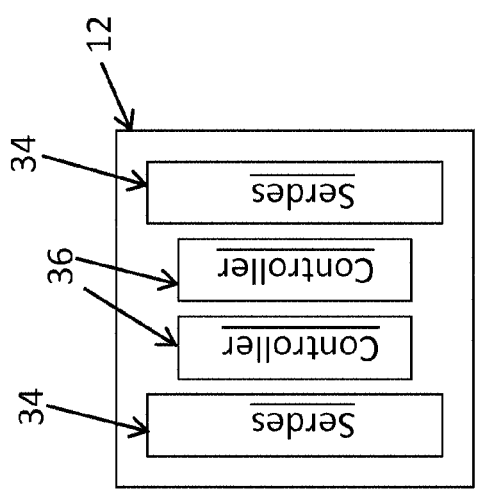
FIGS. 5 and 6 illustrate the floor planes of a logic die and a memory die in accordance with some embodiments.
Figure 6:
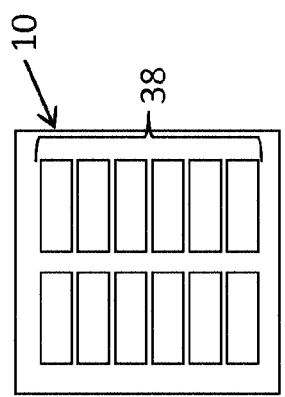

Simulations were performed to calculate the heat dissipating efficiency of the package in FIG. 4. FIGS. 5 and 6 illustrate some exemplary floor planes of dies 12 and 10, respectively, which were used in the simulations. For example, in FIG. 5, die 12 includes high-power-consuming circuits 34 and low-power-consuming circuits 36 consuming less power than high-power-consuming circuits 34. The high-power-consuming circuits 34 may be Serializer/Deserializer (Serdes), and the low-power-consuming circuits may be controllers in some embodiments. Serdes 34 consumes more power, and hence generates more heat, than controllers 36. In accordance with some embodiments, Serdes 34 (or other high-power circuits) are at least partially, and possibly in entirety, allocated in portions 12B of die 12, which portions 12B are not overlapped by dies 10, as shown in FIG. 4. On the other hand, controllers 36 (or other low-power circuits) are at least partially, and possibly entirely, allocated in portion 12A of die 12, which portion 12A is overlapped by dies 10, as shown in FIG. 4. FIG. 6 schematically illustrates an exemplary floor plane of die 10, which is a memory die in these embodiments. Memory die 10 may include a plurality of memory storage banks 38 distributed throughout die 10.

As shown in FIG. 4, by creating heat paths 32B, the heat generated in the high-power-consuming circuits in die 12 may be conveniently dissipated to TIM portion 16B, then to heat dissipating lid 24. The heat dissipating efficiency is thus improved. Simulations were performed based on the dies in FIGS. 5 and 6. The simulation results indicated that by forming sidewall portions 16B for TIM 16, and making sidewall TIM portions 16B to contact heat dissipating lid 24, the operation temperature of the high-power-circuits portion of a sample logic die (as shown in FIG. 5) is reduced from 90.5° C. in conventional packages to 82.2° C. in accordance with embodiments. Furthermore, the operation temperature of the low-power-circuits portion of the sample logic die is reduced from 77.9° C. in conventional packages to 75.1° C. in accordance with embodiments. In the conventional packages, the respective TIM does not include the sidewall portions, and the heat dissipating lid does not include the ring portion. Therefore, by adopting the heat dissipating schemes of the embodiments of the present disclosure, not only the operation temperatures of the packages are lowered, the hot spots are also significantly reduced.

FIGS. 7 through 10A illustrate the cross-sectional views in the formation of packages 100 in accordance with alternative embodiments. These embodiments are similar to the embodiments in FIGS. 1 through 4, except the heat dissipating lid 24 in FIG. 4 is separated into discrete heat dissipating ring 20 and heat dissipating lid 24. Heat dissipating ring 20 may be formed of a material selected from the same candidate materials for forming heat dissipating lid 24. Unless specified otherwise, the materials and the formation methods of the components in these embodiments are essentially the same as the like components, which are denoted by like reference numerals in the embodiments shown in FIGS. 1 through 4. The details regarding the formation process and the materials of the components shown in FIGS. 7 through 10A may thus be found in the discussion of the embodiment shown in FIGS. 1 through 4.

Figure 7:
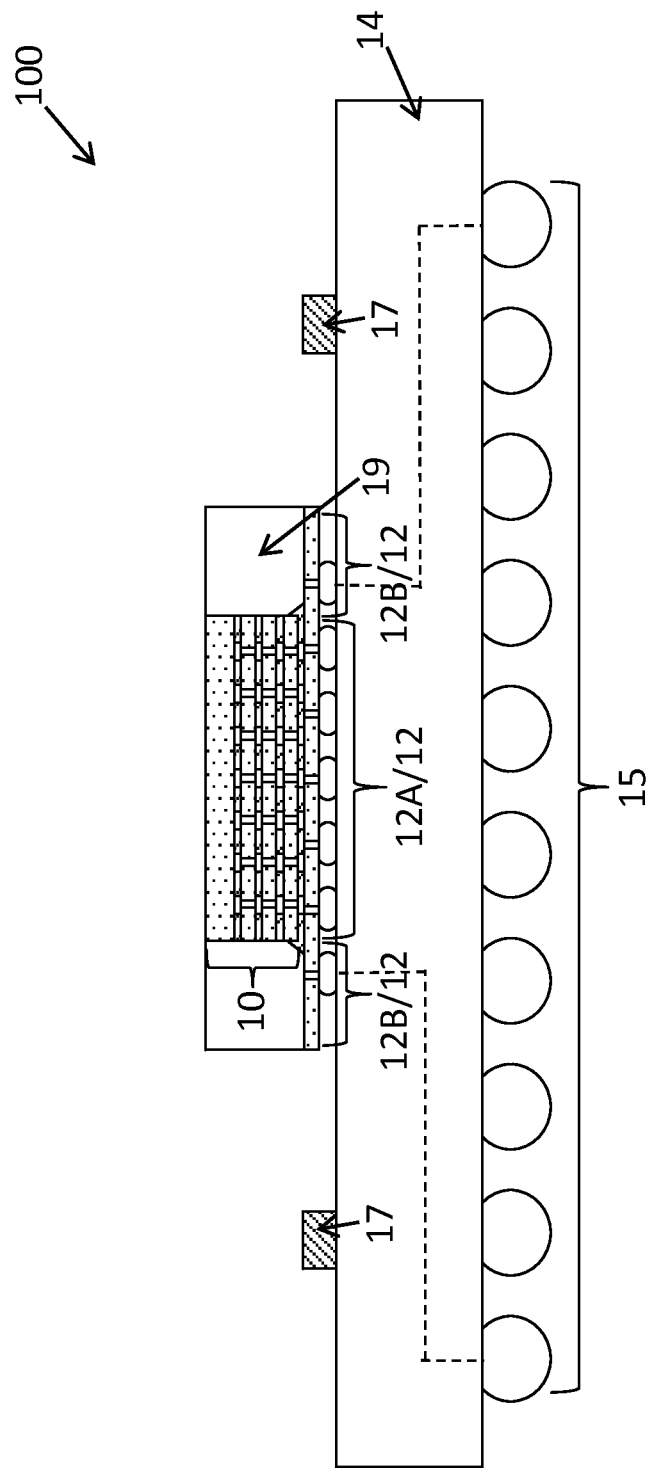
Figure 8:
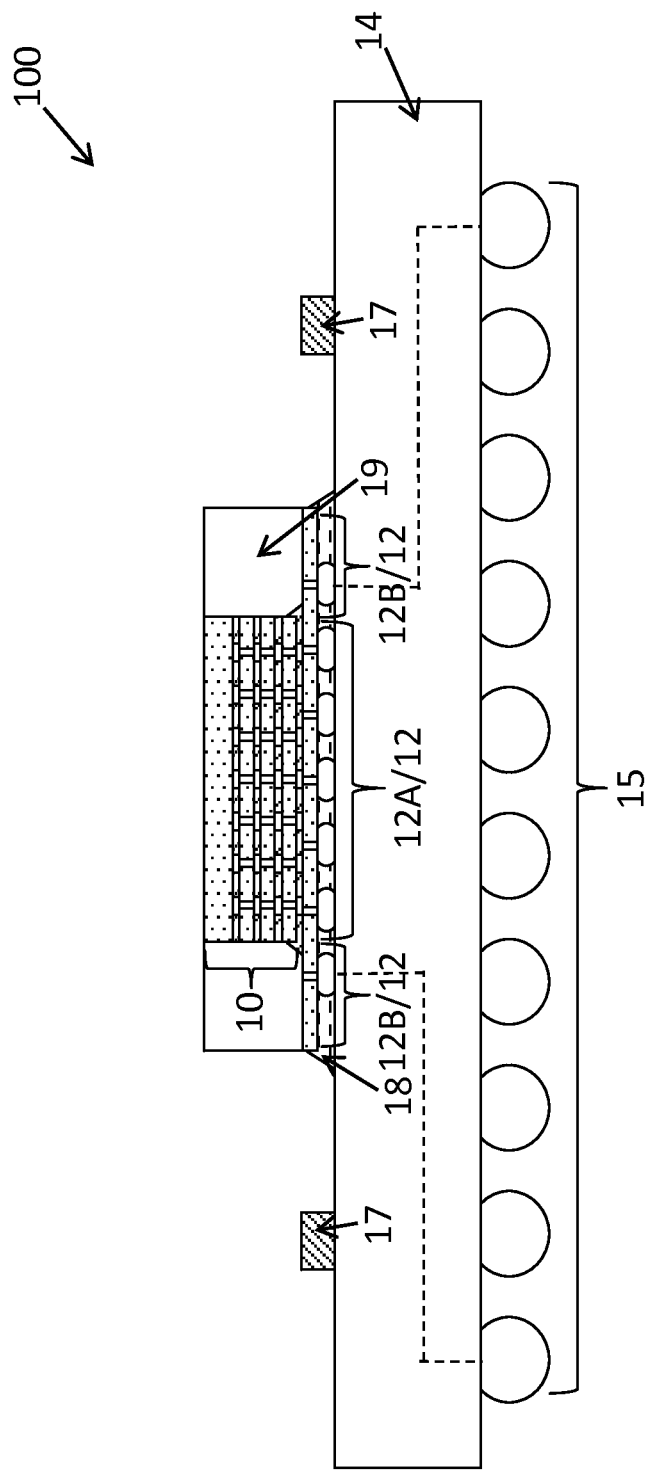
Figure 9:
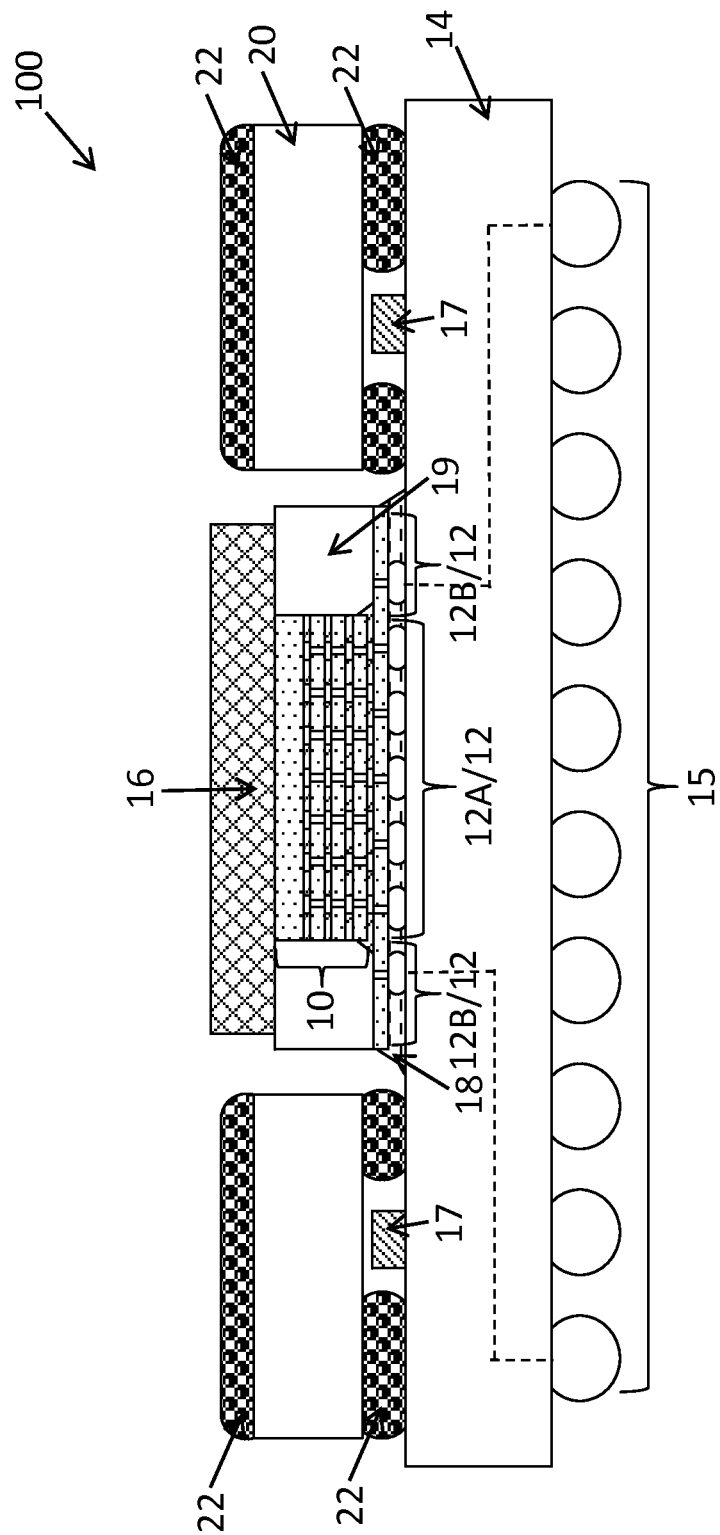

FIGS. 7 and 8 are essentially the same as FIGS. 1 and 2, respectively. Next, referring to FIG. 9, adhesive 22 is applied over package component 14, and heat dissipating ring 20 is mounted over package component 14 through adhesive 22. Heat dissipating ring 20 may form a full ring encircling dies 10 and 12, although it may also be a partial ring or include a plurality of discrete pieces in alternative embodiments. Next, additional adhesive 22 is dispensed over heat dissipating ring 20.

Figure 10A:
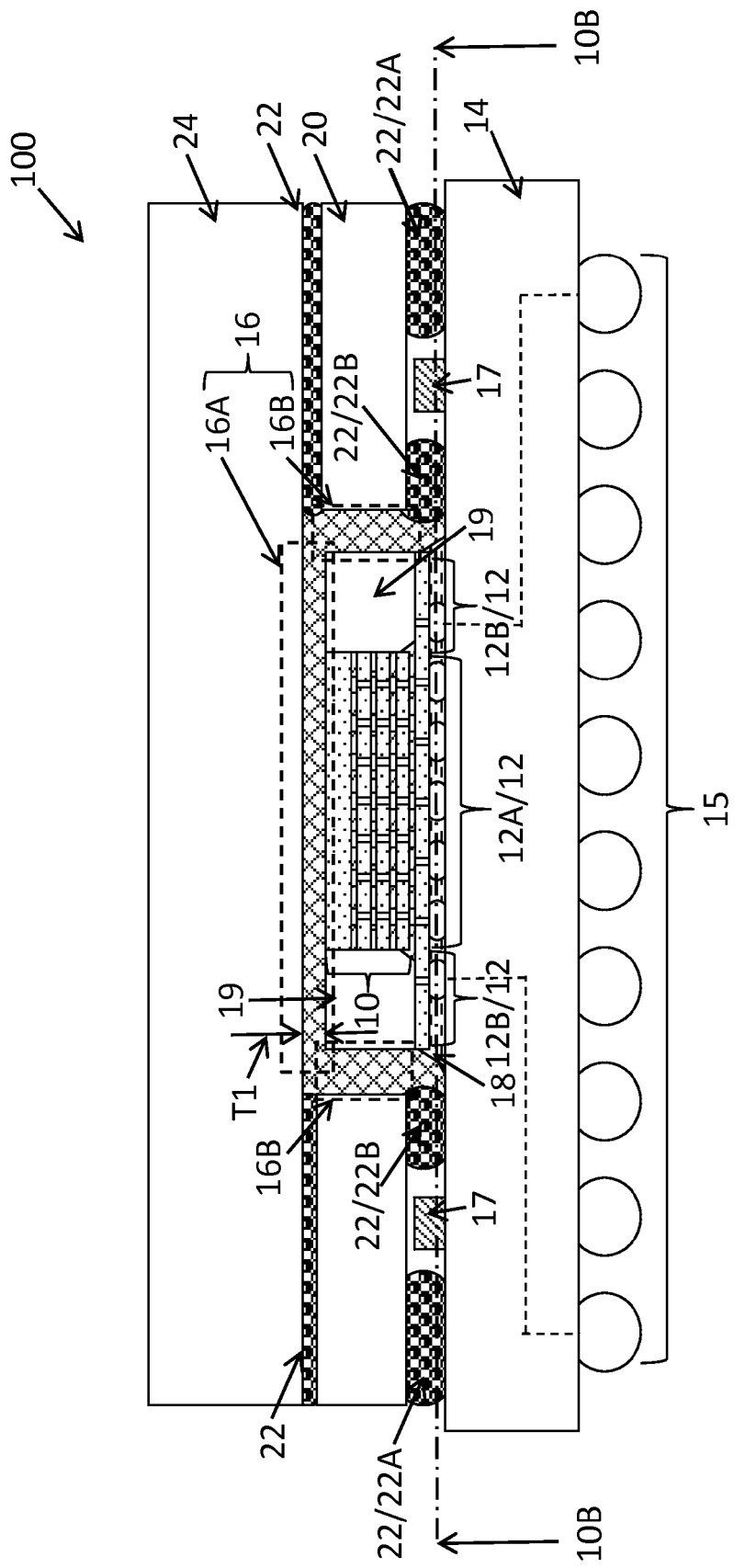

In FIG. 10A, heat dissipating lid 24 is mounted over TIM 16, adhesive 22, and heat dissipating ring 20. TIM 16 is squeezed to the sidewalls of molding compound 19, and hence is in contact with the inner sidewalls of heating dissipating ring 20 and the outer sidewalls of molding compound 19. Accordingly, heat dissipating ring 20 has the function of dissipating the heat in molding compound 19. Again, in these embodiments, sidewall portion(s) 16B of TIM 16 may form a full ring, a partial ring, or may include a plurality of discrete pieces.

Figure 10B:
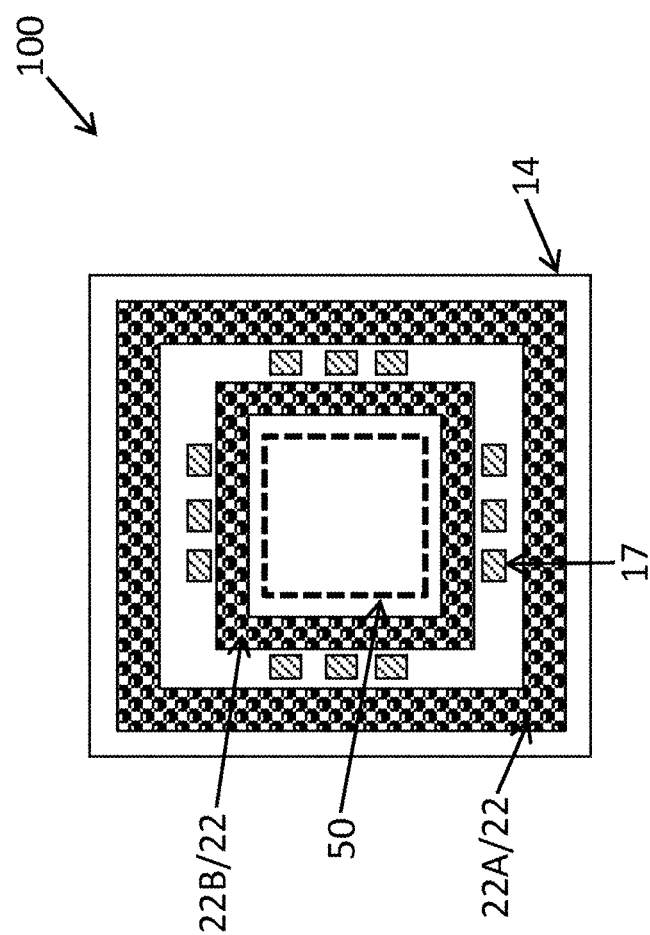
FIG. 10B illustrates a top view of the package in FIG. 10A.

FIG. 10B illustrates a top view of the package as shown in FIG. 10A. The top view in FIG. 10B is obtained from the horizontal plane containing line 10B-10B in FIG. 10A. Adhesive 22 includes inner portion 22B and the outer portion 22A. In some embodiments, each of adhesives 22A and 22B forms a ring, which may encircle die stacks 10/12 (FIG. 10A). Furthermore, outer portion 22A may encircle inner portion 22B. The footprint of die stacks 10 is marked as 50. Discrete passive devices 17 may be disposed between the ring of adhesive 22A and the ring of adhesive 22B.

Figure 11:
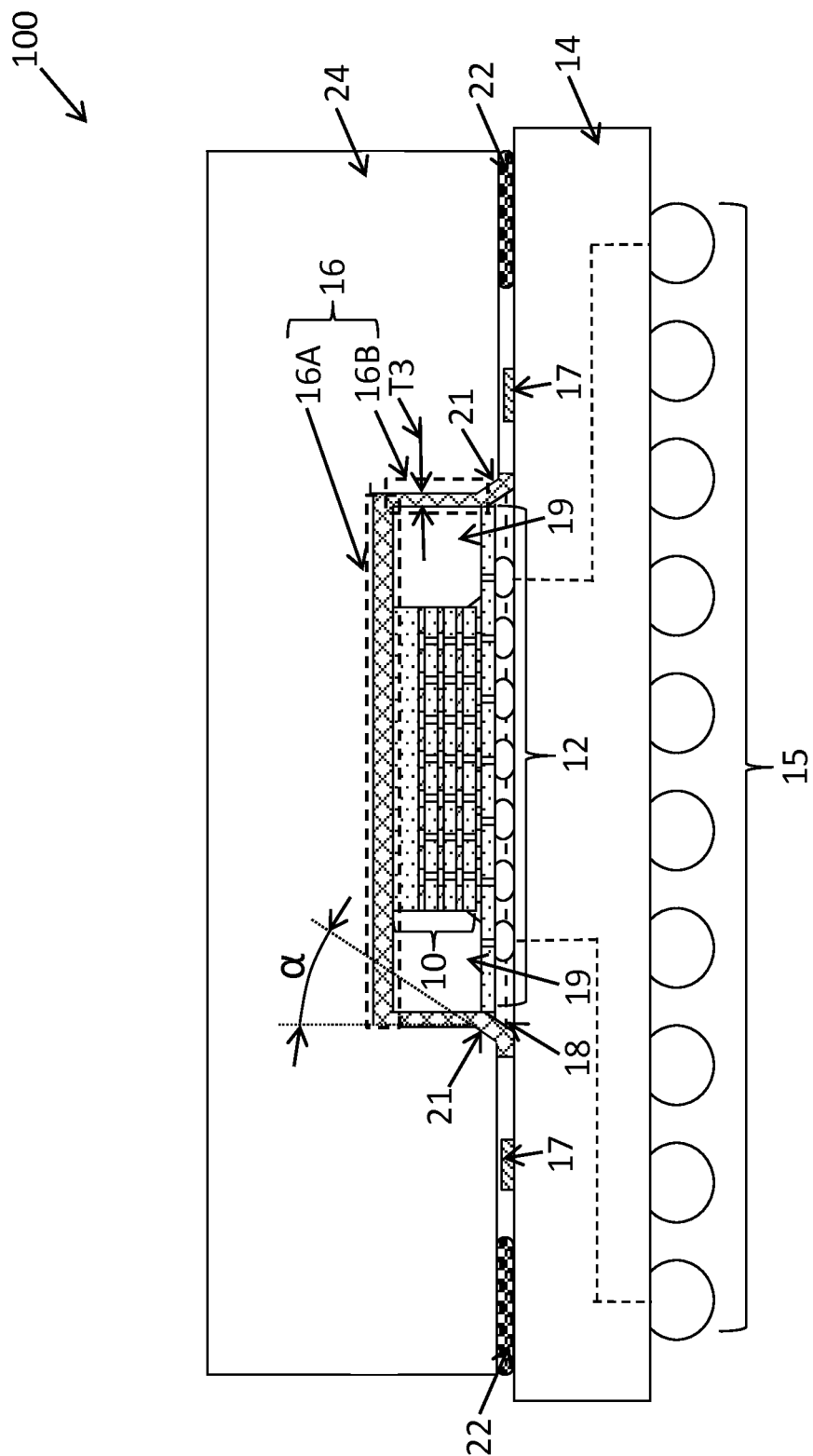
FIG. 11 illustrates a cross-sectional view of a package, wherein the lid includes chamfers.

FIG. 11 illustrates package 100 in accordance with alternative embodiments. In these embodiments, chamfers 21 are formed at the inner and bottom corners of heat dissipating lid 24. Chamfers 21 may be tilted, for example, with the tilt angle α being in the range between about 20 degrees and about 70 degrees, or in the range between about 30 degrees and about 60 degrees. Chamfers 21 may also be substantially parallel to the tilt edges of underfill 18. Chamfers 21, although illustrated as discrete portions in FIG. 11, may form a chamfer ring in the top view or bottom view of FIG. 11. With the edges of underfill 18 and chamfers 21 both being tilted with similar tilt angles, thickness T3 of TIM portion 16B may be reduced without the concern that the sidewall portion 24C of heat dissipating lid 24 touches underfill 18. For example, thickness T3 of the sidewall TIM portion 16B may be between about 0.1 mm and about 0.5 mm.

Figure 12:
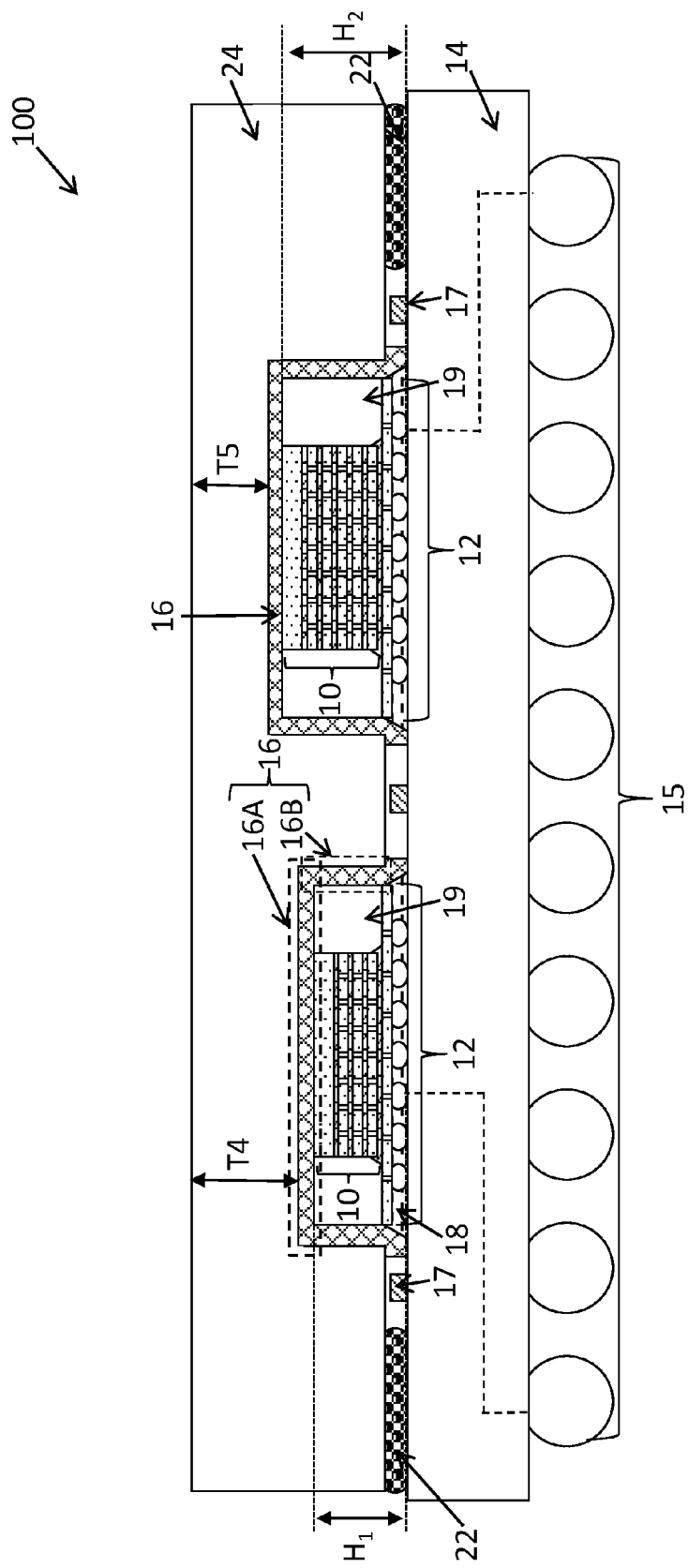
FIG. 12 illustrates the cross-sectional view of a package in accordance with some embodiments, wherein stacked dies have different heights extend into the recesses of a heat dissipating lid.

FIGS. 12 through 15 illustrate the heat dissipation schemes in accordance with alternative embodiments. FIG. 12 illustrates a plurality of die stacks 10/12 bonded to package component 14. In the illustrated examples, there are two die stacks 10/12 having heights H1 and H2, which may be equal to each other or different from each other. Accordingly, heat dissipating lid 24 comprises two recesses, with each of die stacks 10/12 extending into one of the recesses. The depths and the widths of the recesses in heat dissipating lid 24 may be chosen, so that the top portions and the sidewall portions of TIM 16 have small thicknesses in order to have good heat dissipating efficiency. As shown in FIG. 12, the recessed portions of heat dissipating lid 24 have different thicknesses T4 and T5.

Figure 13A:
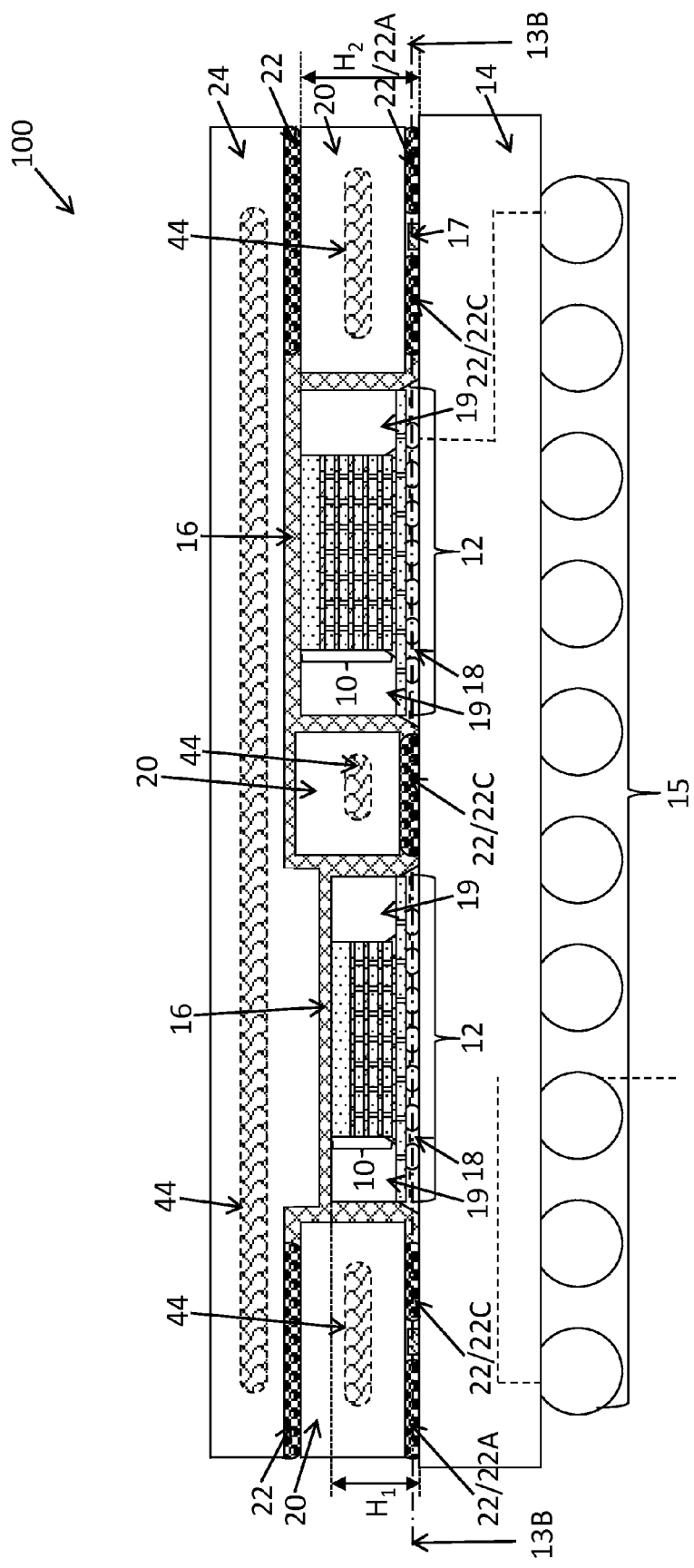
FIGS. 13A and 13B illustrate the cross-sectional view and the top view, respectively, of a package in accordance with some embodiments, wherein a package includes heat pipes embedded in a heat dissipating lid and a heat dissipating ring.
Figure 13B:
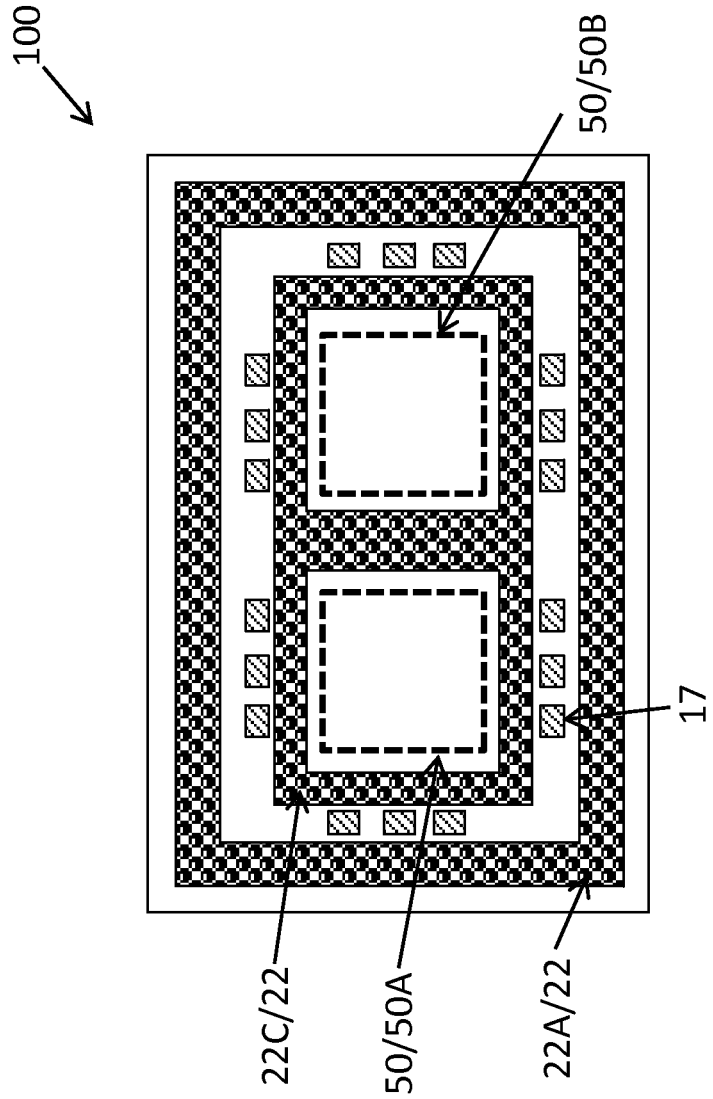

FIG. 13A illustrates package 100 including heat pipes 44 embedded in heat dissipating lid 24 and/or heat dissipating ring 20. FIG. 13B illustrates a top view of the package shown in FIG. 13A. The top view in FIG. 13B is obtained from the horizontal plane containing line 13B-13B in FIG. 13A. Adhesive 22 includes inner portion 22C and the outer portion 22A. In some embodiments, each of adhesives 22A and 22C forms a ring, which may encircle die stacks 10/12 (FIG. 13A). Furthermore, outer portion 22A may encircle inner portion 22C. The footprint of die stacks 10/12 (FIG. 13A) are marked as 50 (including 50A and 50B), which correspond to the die stacks 10/12 on the left side and the die stacks 10/12 on the right side of FIG. 13A. Discrete passive devices 17 may be disposed between the rings of adhesive portions 22A and 22C.

Figure 14A:
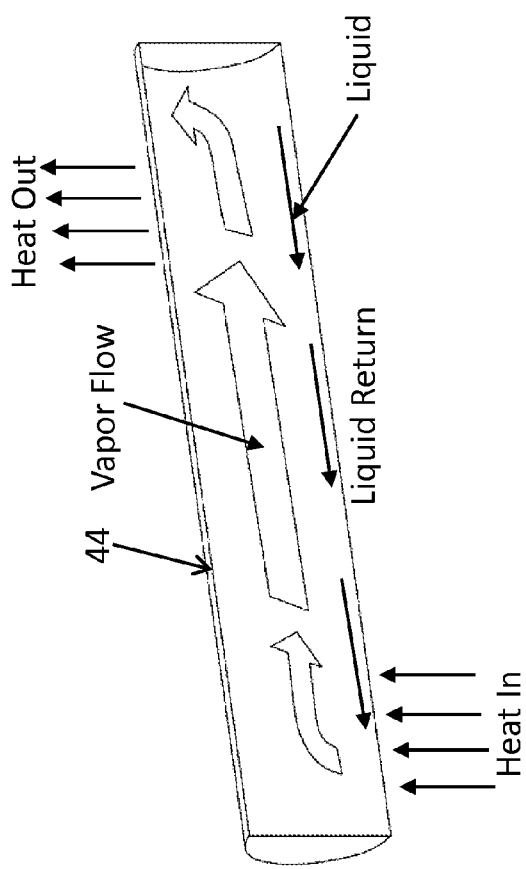
FIGS. 14A, 14B, and 14C illustrate various views of the package with the heat pipes.
Figure 14C:
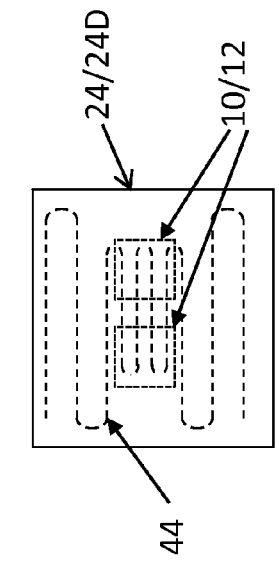
Figure 14B:
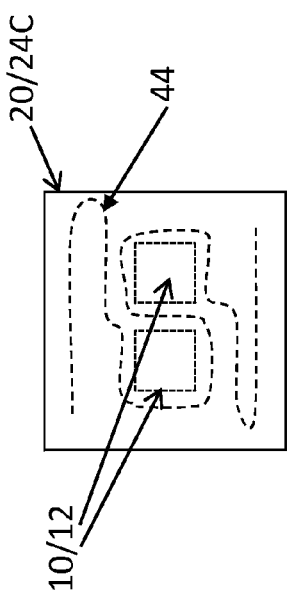

FIG. 14A schematically illustrates the mechanism of heat pipes 44. FIG. 14B illustrates the top view of heat dissipating ring 20 (or portion 24C in FIG. 10A) and the respective heat pipes 44 therein. FIG. 14C illustrates the top view of dissipating ring 24 (or portion 24D in FIG. 10A) and the respective heat pipes 44 therein. As shown in FIG. 14A, heat pipe 44 includes liquid therein. The liquid, when being close to dies 10 and 12 (FIGS. 14B and 14C) is turned into a vapor by absorbing heat from dies 10 and 12. The vapor then travels along heat pipe 44 to cold regions, for example, to the perimeter parts of dissipating lid 24 and heat dissipating ring 20, or to the top surface of heat dissipating lid 24. The vapor condenses back into liquid, hence releasing the heat. The liquid then returns to the hot regions through either capillary action or gravity, and the cycle repeats.

Figure 15:
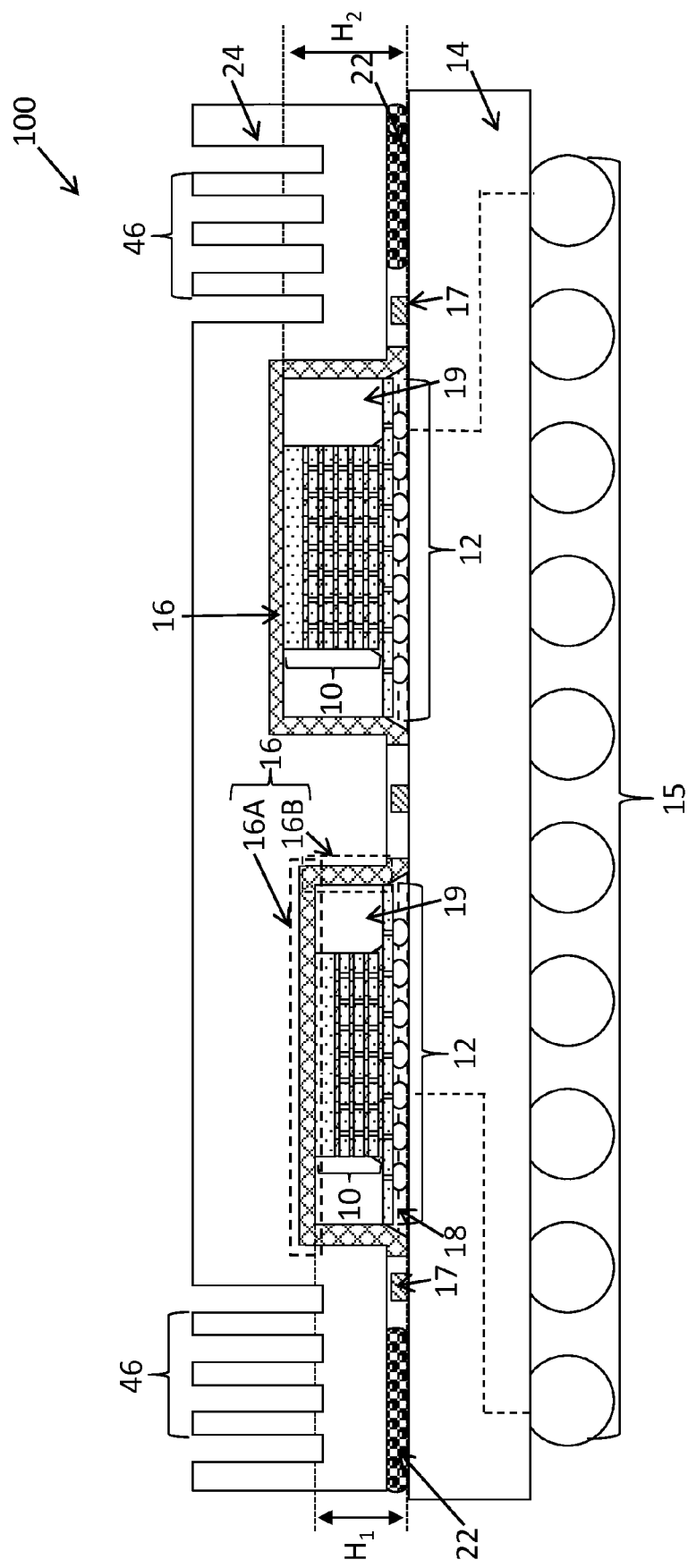
FIG. 15 illustrates a cross-sectional view of a package in accordance with some embodiments, wherein a heat dissipating lid includes heat sinks.

FIG. 15 illustrates the heat dissipation scheme in accordance with yet alternative embodiments. These embodiments are similar to the embodiments in FIG. 12, except that heat dissipating lid 24 is also a heat sink comprising fins 46 and recesses separating the fins. With the fins, the heat dissipating ability of heat dissipating lid 24 is improved due to increased surface areas.

The embodiments of the present disclosure have some advantageous features. By forming the TIMs on the sidewalls of the stacked dies, which TIMs conduct heat to heat dissipating rings and/or lids, the heat in packages may be dissipated more efficiently due to the introduction of the extra heat dissipating paths.

In accordance with some embodiments, a package includes a die stack that includes at least two stacked dies, and a TIM. The TIM includes a top portion over and contacting a top surface of the die stack, and a sidewall portion extending from the top portion down to lower than at least one of the at least two stacked dies. A first metallic heat-dissipating feature is over and contacting the top portion of TIM. A second metallic heat-dissipating feature has a sidewall contacting a sidewall of the sidewall portion of the TIM.

In accordance with other embodiments, a package includes a package component, a die stack over and bonded to the package component, a molding compound encircling and contacting the die stack, and a TIM. The TIM includes a top portion over and contacting a top surface of the die stack, and a ring portion encircling and contacting sidewalls of the molding compound. A first metallic heat-dissipating feature is overlying and contacting the top portion of TIM. A second metallic heat-dissipating feature encircles and contacts the ring portion of the TIM.

In accordance with yet other embodiments, a package includes a package substrate, a die stack over and bonded to the package substrate, a molding compound encircling and contacting a portion of the die stack, and an adhesive over and contacting the package substrate. A TIM has a top portion over and contacting a top surface of the die stack, and a ring portion encircling and contacting sidewalls of the molding compound. A heat dissipating lid includes a top portion over and contacting the top portion of TIM, and a ring portion connected to the top portion of the heat dissipating lid. The ring portion of the heat dissipating lid encircles and contacts sidewalls of the ring portion of the TIM. A bottom surface of the ring portion of the heat dissipating lid is over and contacting the adhesive.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A package comprising:
a die stack comprising at least two stacked dies, wherein the die stack comprises:
a first die; and
a second die underlying the first die and comprising:
a first portion overlapped by the first die; and
a second portion not overlapped by the first die;
a Thermal Interface Material (TIM) comprising:
a top portion over and contacting a top surface of the die stack; and
a sidewall portion extending from the top portion down to lower than at least one of the at least two stacked dies, wherein the top portion and the sidewall portion are formed of a same homogenous material;
a molding compound comprising:
inner sidewalls contacting edges of dies in the die stack; and
outer sidewalls contacting sidewalls of the sidewall portion of the TIM, wherein the outer sidewalls are co-terminus with respective sidewalls of the second die, and wherein both the inner sidewalls and outer sidewalls extend from a top surface of the die stack to a top surface of the second die;
a first metallic heat-dissipating feature over and contacting the top portion of the TIM;
a second metallic heat-dissipating feature comprising a sidewall contacting a first sidewall of the sidewall portion of the TIM, wherein the second metallic heat-dissipating feature is at a same level as the die stack; and
a heat pipe, with an entirety of the heat pipe in the second metallic heat-dissipating feature, wherein the heat pipe comprises a liquid therein, with the heat pipe configured to vaporize the liquid as a vapor, and condense the vapor to liquid, wherein in a top view of the package, the heat pipe encircles without crossing the die stack.

2. The package of claim 1, wherein the second metallic heat-dissipating feature forms a full ring encircling the die stack.

3. The package of claim 1, wherein the first metallic heat-dissipating feature and the second metallic heat-dissipating feature are portions of an integrated metallic heat-dissipating feature.

4. The package of claim 1, wherein the first metallic heat-dissipating feature and the second metallic heat-dissipating feature are separated from each other by an adhesive.

5. The package of claim 1 further comprising an additional adhesive, wherein the additional adhesive comprises a first portion forming a first ring, and a second portion forming a second ring encircling the first ring, wherein the first ring and the second ring are separated from each other, wherein a first top surface of the first ring and a second top surface of the second ring are in contact with a same bottom surface of the second metallic heat-dissipating feature.

6. The package of claim 5 further comprising a discrete passive device disposed between the first ring and the second ring of the additional adhesive.

7. The package of claim 1, wherein the second die comprises a high-power-consuming circuit and a low-power-consuming circuit consuming less power than the high-power-consuming circuit, and the high-power-consuming circuit is at least partially located in the second portion of the second die, and the high-power-consuming circuit comprises a serializer or a deserializer, and the low-power-consuming circuit comprises a controller.

8. A package comprising:
a package component;
a die stack over and bonded to the package component, wherein the die stack comprises at least two stacked dies;
a molding compound encircling and contacting the die stack;
a Thermal Interface Material (TIM) comprising:
a top portion over and contacting a top surface of the die stack; and
a ring portion encircling and contacting sidewalls of the molding compound, wherein the top portion is continuously connected to the ring portion with no distinguishable interface therebetween;
a first metallic heat-dissipating feature over and contacting the top portion of the TIM;
a second metallic heat-dissipating feature encircling and contacting the ring portion of the TIM, wherein the second metallic heat-dissipating feature is at a same level as the die stack; and
a heat pipe, with an entirety of the heat pipe in the second metallic heat-dissipating feature, wherein the heat pipe comprises a liquid therein, with the heat pipe configured to vaporize the liquid as a vapor, and condense the vapor to liquid, wherein in a top view of the package, the heat pipe encircles without crossing the die stack.

9. The package of claim 8 further comprising:
an additional die stack comprising an additional top surface higher than the top surface of the die stack, wherein the second metallic heat-dissipating feature further encircles the additional die stack; and
an additional TIM over the additional top surface, wherein the first metallic heat-dissipating feature is over and contacting the additional TIM, wherein a bottom surface of the TIM is lower than a bottom surface of the additional TIM.

10. The package of claim 8, wherein the heat pipe is configured to vaporize the liquid as a vapor, and condense the vapor to liquid.

11. The package of claim 8 further comprising a heat sink in the first metallic heat-dissipating feature.

12. The package of claim 8, wherein the die stack comprises:
a first die; and
a second die underlying and bonded to the first die, wherein the second die comprises:
a first portion overlapped by the first die; and a second portion not overlapped by the first die, wherein the second die comprises a high-power-consuming circuit and a low-power-consuming circuit consuming less power than the high-power-consuming circuit, and the high-power-consuming circuit is at least partially located in the second portion of the second die.

13. A package comprising:
a package substrate;
a die stack over and bonded to the package substrate, wherein the die stack comprises at least two stacked dies;
a molding compound comprising:
    an inner edge encircling and contacting a top die of the die stack; and
    an outer edge opposite to the inner edge, with the outer edge being in a same vertical plane as an edge of a bottom die of the die stack;
an adhesive over and contacting the package substrate;
a Thermal Interface Material (TIM) comprising:
    a top portion over and contacting a top surface of the die stack; and
    a ring portion encircling and contacting sidewalls of the molding compound;
a heat dissipating lid comprising:
    a top portion over and contacting the top portion of the TIM; and
    a ring portion connected to the top portion of the heat dissipating lid, with the ring portion being coplanar with the die stack, wherein the ring portion of the heat dissipating lid encircles and contacts sidewalls of the ring portion of the TIM, and wherein a bottom surface of the ring portion of the heat dissipating lid is over and contacting the adhesive; and
a heat pipe, with an entirety of the heat pipe in the ring portion of the heat dissipating lid, wherein the heat pipe comprises a liquid therein, with the heat pipe configured to vaporize the liquid as a vapor, and condense the vapor to liquid, wherein in a top view of the package, the heat pipe encircles without crossing the die stack.

14. The package of claim 13, wherein the adhesive comprises:
    an inner portion forming a first ring; and
    an outer portion forming a second ring encircling the first ring.

15. The package of claim 13, wherein the ring portion of the heat dissipating lid comprises a chamfer contacting a bottom portion of the ring portion of the TIM.

16. The package of claim 15, wherein the chamfer forms a ring encircling the die stack.

17. The package of claim 15, wherein the heat dissipating lid comprises a heat sink, with the heat sink comprising a plurality of fins separated by trenches.

18. The package of claim 13 further comprising:
    an additional die stack comprising an additional top surface higher than the top surface of the die stack, wherein the heat dissipating lid further comprises an additional ring portion encircling the additional die stack; and
    an additional TIM over the additional top surface, wherein the top portion of the heat dissipating lid is over and contacting the additional TIM.

19. The package of claim 13, wherein in the top view of the package, the heat pipe forms a back-and-forth pattern on each of opposite sides of the die stack.

* * * * *